United States Patent
Stormberg et al.

(10) Patent No.: US 10,811,576 B2
(45) Date of Patent: Oct. 20, 2020

(54) COLOR TUNING OF LIGHT-EMITTING DEVICES

(71) Applicant: Quarkstar LLC, Las Vegas, NV (US)

(72) Inventors: Hans Peter Stormberg, Stolberg (DE); Roland H. Haitz, Portola Valley, CA (US); Ferdinand Schinagl, North Vancouver (CA)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 14/776,402

(22) PCT Filed: Mar. 14, 2014

(86) PCT No.: PCT/US2014/029230
§ 371 (c)(1),
(2) Date: Sep. 14, 2015

(87) PCT Pub. No.: WO2014/144706
PCT Pub. Date: Sep. 18, 2014

(65) Prior Publication Data
US 2016/0035949 A1    Feb. 4, 2016

Related U.S. Application Data

(60) Provisional application No. 61/788,737, filed on Mar. 15, 2013.

(51) Int. Cl.
*H01L 33/58*    (2010.01)
*H01L 33/50*    (2010.01)
(Continued)

(52) U.S. Cl.
CPC .......... *H01L 33/58* (2013.01); *H01L 25/0753* (2013.01); *H01L 33/08* (2013.01);
(Continued)

(58) Field of Classification Search
CPC ..... H01L 33/08; H01L 33/502; H01L 33/504; H01L 33/58
See application file for complete search history.

(56) References Cited

U.S. PATENT DOCUMENTS 3,960,579 A    6/1976    Broemer
4,038,448 A    7/1977    Boyd
(Continued)

FOREIGN PATENT DOCUMENTS

EP               2293354 A1    3/2011
EP    PCT/IB2011/052874    6/2011
(Continued)

OTHER PUBLICATIONS

Allen, et al. "A nearly ideal phosphor-converted white light-emitting diode", Applied Physics Letters, vol. 92 (2008) 3 pages.
(Continued)

*Primary Examiner* — Matthew E Warren
(74) *Attorney, Agent, or Firm* — Fish & Richardson P.C.

(57) ABSTRACT

A variety of light-emitting devices for general illumination utilizing solid state light sources (e.g., light-emitting diodes) are disclosed. A light-emitting device can include a first light-emitting element (LEE) for emitting light having a first spectral composition, a second LEE for emitting light having a second spectral composition, and a scattering element surrounding at least in part the first and second LEEs to scatter light emitted from the first and second LEEs. The light-emitting device can also include electrical connections for connecting the first and second LEEs to a power source, where the electrical connections are arranged such that power to the first LEE is separately adjustable relative to power to the second LEE.

26 Claims, 6 Drawing Sheets

(51) Int. Cl.
*H01L 33/08* (2010.01)
*H01L 25/075* (2006.01)
*H05B 45/10* (2020.01)
*H01L 33/60* (2010.01)
*H01L 33/62* (2010.01)
*H01L 25/16* (2006.01)
*F21Y 115/10* (2016.01)
*F21Y 113/17* (2016.01)

(52) U.S. Cl.
CPC ............ *H01L 33/50* (2013.01); *H01L 33/502* (2013.01); *H01L 33/504* (2013.01); *H01L 33/60* (2013.01); *H01L 33/62* (2013.01); *H05B 45/10* (2020.01); *F21Y 2113/17* (2016.08); *F21Y 2115/10* (2016.08); *H01L 25/167* (2013.01); *H01L 2924/0002* (2013.01); *H01L 2933/0091* (2013.01)

(56) References Cited

U.S. PATENT DOCUMENTS

| | | |
|---|---|---|
| 4,240,692 A | 12/1980 | Winston |
| 4,301,461 A | 11/1981 | Asano |
| 4,374,749 A | 2/1983 | Cusano |
| 4,389,118 A | 6/1983 | Yuasa |
| 4,797,609 A | 1/1989 | Yang |
| 4,907,044 A | 3/1990 | Schellhorn |
| 5,001,609 A | 3/1991 | Gardner |
| 5,055,892 A | 10/1991 | Gardner |
| 5,268,635 A | 12/1993 | Bortolini |
| 5,282,088 A | 1/1994 | Davidson |
| 5,335,152 A | 8/1994 | Winston |
| 5,424,855 A | 6/1995 | Nakamura |
| 5,727,108 A | 3/1998 | Hed |
| 5,856,727 A | 1/1999 | Schroeder |
| 6,095,655 A | 8/2000 | Bigliati |
| 6,111,367 A | 8/2000 | Asano |
| 6,155,699 A | 12/2000 | Miller |
| 6,236,331 B1 | 5/2001 | Dussureault |
| 6,479,942 B2 | 11/2002 | Kimura |
| 6,495,964 B1 | 12/2002 | Muthu |
| 6,527,411 B1 | 3/2003 | Sayers |
| 6,617,560 B2 | 9/2003 | Forke |
| 6,642,618 B2 | 11/2003 | Yagi |
| 6,819,505 B1 | 11/2004 | Cassarly |
| 7,015,514 B2 | 3/2006 | Baur |
| 7,091,653 B2 | 8/2006 | Ouderkirk |
| 7,151,283 B2 | 12/2006 | Reeh |
| 7,286,296 B2 | 10/2007 | Chaves |
| 7,306,960 B2 | 12/2007 | Bogner |
| 7,329,907 B2 | 2/2008 | Pang |
| 7,329,998 B2 | 2/2008 | Jungwirth |
| 7,344,902 B2 | 3/2008 | Basin |
| 7,355,284 B2 | 4/2008 | Negley |
| 7,514,867 B2 | 4/2009 | Yano |
| 7,522,802 B2 | 4/2009 | Shiau |
| 7,828,453 B2 | 11/2010 | Tran |
| 7,859,190 B2 | 12/2010 | Shi |
| 7,889,421 B2 | 2/2011 | Narendran |
| 8,007,118 B2 | 8/2011 | O Neill |
| 8,083,364 B2 | 12/2011 | Allen |
| 8,168,998 B2 | 5/2012 | David |
| 8,314,537 B2 | 11/2012 | Gielen |
| 8,362,695 B2 | 1/2013 | Aanegola |
| 8,436,380 B2 | 5/2013 | Aanegola |
| 8,598,778 B2 | 12/2013 | Allen |
| 8,791,631 B2 | 7/2014 | Allen |
| 2003/0117087 A1 | 6/2003 | Barth |
| 2003/0235050 A1* | 12/2003 | West ................ F21V 5/04 362/327 |
| 2004/0052076 A1* | 3/2004 | Mueller ............ F21V 23/0442 362/293 |
| 2004/0150991 A1 | 8/2004 | Ouderkirk |
| 2005/0023545 A1 | 2/2005 | Camras |
| 2005/0075234 A1 | 4/2005 | Wolff |
| 2005/0127833 A1 | 6/2005 | Tieszen |
| 2005/0184638 A1* | 8/2005 | Mueller ............ C09K 11/7774 313/485 |
| 2005/0185416 A1 | 8/2005 | Lee |
| 2005/0243570 A1 | 11/2005 | Chaves |
| 2005/0269582 A1 | 12/2005 | Mueller |
| 2006/0152140 A1 | 7/2006 | Brandes |
| 2006/0152931 A1 | 7/2006 | Holman |
| 2006/0255353 A1 | 11/2006 | Taskar |
| 2007/0018102 A1 | 1/2007 | Braune |
| 2007/0256453 A1 | 11/2007 | Barnes |
| 2007/0257267 A1 | 11/2007 | Leatherdale |
| 2007/0273282 A1 | 11/2007 | Radkov |
| 2008/0054280 A1 | 3/2008 | Reginelli |
| 2008/0079910 A1 | 4/2008 | Rutherford |
| 2008/0080166 A1 | 4/2008 | Duong |
| 2008/0101754 A1 | 5/2008 | Parker |
| 2008/0112183 A1* | 5/2008 | Negley ................ F21K 9/52 362/555 |
| 2008/0297027 A1* | 12/2008 | Miller ............ H05B 33/0812 313/498 |
| 2009/0008662 A1* | 1/2009 | Ashdown ........... H01L 25/0753 257/98 |
| 2009/0050919 A1* | 2/2009 | Weijers ............ H01L 33/504 257/98 |
| 2009/0200939 A1 | 8/2009 | Lenk |
| 2009/0201677 A1 | 8/2009 | Hoelen |
| 2009/0272996 A1 | 11/2009 | Chakraborty |
| 2009/0310352 A1 | 12/2009 | Chang |
| 2010/0066236 A1 | 3/2010 | Xu |
| 2010/0073927 A1 | 3/2010 | Lewin |
| 2010/0097821 A1 | 4/2010 | Huang |
| 2010/0123386 A1 | 5/2010 | Chen |
| 2010/0134016 A1 | 6/2010 | York |
| 2010/0148151 A1 | 6/2010 | Camras |
| 2010/0172120 A1 | 7/2010 | Wegh |
| 2010/0232134 A1 | 9/2010 | Tran |
| 2010/0263723 A1* | 10/2010 | Allen ................ C09K 11/02 136/259 |
| 2010/0264432 A1 | 10/2010 | Liu |
| 2010/0290226 A1 | 11/2010 | Harbers |
| 2010/0301367 A1 | 12/2010 | Nakamura |
| 2010/0308354 A1 | 12/2010 | David |
| 2011/0080108 A1 | 4/2011 | Chiang |
| 2011/0089817 A1 | 4/2011 | Lyons |
| 2011/0176091 A1 | 7/2011 | Boonekamp |
| 2011/0182065 A1 | 7/2011 | Negley |
| 2011/0227037 A1* | 9/2011 | Su ................ C23C 16/0227 257/13 |
| 2011/0235306 A1* | 9/2011 | Li ................ H01L 25/0753 362/84 |
| 2011/0267800 A1 | 11/2011 | Tong |
| 2011/0267801 A1* | 11/2011 | Tong ................ F21V 9/16 362/84 |
| 2011/0273882 A1 | 11/2011 | Pickard |
| 2011/0291130 A1 | 12/2011 | Diana |
| 2011/0298371 A1 | 12/2011 | Brandes |
| 2012/0033403 A1 | 2/2012 | Lamvik |
| 2012/0039073 A1 | 2/2012 | Tong |
| 2012/0068205 A1 | 3/2012 | Galvez |
| 2012/0112661 A1 | 5/2012 | van de Ven |
| 2012/0119221 A1 | 5/2012 | Negley |
| 2012/0127694 A1 | 5/2012 | Richardson |
| 2012/0140436 A1* | 6/2012 | Yang ................ F21V 13/02 362/84 |
| 2012/0147296 A1 | 6/2012 | Montgomery |
| 2012/0181565 A1 | 7/2012 | David |
| 2012/0187441 A1 | 7/2012 | Li |
| 2012/0327656 A1 | 12/2012 | Ramer |
| 2013/0021776 A1 | 1/2013 | Veerasamy |
| 2013/0038219 A1 | 2/2013 | Dau |
| 2013/0039090 A1 | 2/2013 | Dau |
| 2013/0201715 A1 | 8/2013 | Dau |
| 2014/0191655 A1* | 7/2014 | Kasakura ............ H01L 25/0753 315/32 |

(56) References Cited

U.S. PATENT DOCUMENTS

| | | | |
|---|---|---|---|
| 2014/0226335 A1* | 8/2014 | Menkara | F21V 13/14 362/259 |
| 2014/0333198 A1 | 11/2014 | Allen | |
| 2015/0003059 A1 | 1/2015 | Haitz | |

FOREIGN PATENT DOCUMENTS

| | | |
|---|---|---|
| WO | WO2001007828 A1 | 2/2001 |
| WO | WO2001027962 A3 | 1/2002 |
| WO | WO2003017729 A1 | 2/2003 |
| WO | WO2004076916 A1 | 9/2004 |
| WO | WO2007081812 A3 | 4/2009 |
| WO | WO2013078463 A1 | 5/2013 |

OTHER PUBLICATIONS

Allen, et al. "ELiXIR—Solid-State Luminaire With Enhanced Light Extraction by Internal Reflection", Journal of Display Technology, vol. 3, No. 2, Jun. 2007 pp. 155-159.

Allen, et al., "Highly Efficient light-emitting composite material for solid-state illumination devices, lasers, and luminescent collectors", U.S. Appl. No. 60/961,185, filed Jul. 19, 2007, 38 pages.

Carclo Technical Plastics "Luxeon®I 20 & 26.5mm Range", downloaded from the internet at: http://docs-europe.electrocomponents.com/webdocs/0dcb/0900766b80dcbbeb.pdf on Oct. 30, 2012, 31 pages.

Intematix, "Design Considerations for ChromaLit™ Ellipse, Candle, and Dome Remote Phosphor Light Sources", Jan. 11, 2012, downloaded from the Internet at: http://www.intematix.com/uploads/files/imx-design-considerations-ecd-app-note.pdf , on Oct. 30, 2012, 23 pages.

Intematix, "Mixing Chamber Design Considerations for ChromaLit™ Remote Phosphor Light Sources", Aug. 29, 2012, downloaded from the internet at: http://www.intematix.com/uploads/files/intematix_mixing_chamber_design_for_chromalit.pdf on Oct. 30, 2012, 12 pages.

Liu, et al. "Effects of Phosphor's Location on LED Packaging Performance", 2008 International Conference on Electronic Packaging Technology & High Density Packaging (ICEPT-HDP 2008), 7 pages.

Liu, et al. "Effects of Phosphor's Thickness and Concentration on Performance of White LEDs", 2008 International Conference on Electronic Packaging Technology & High Density Packaging (ICEPT-HDP 2008), 6 pages.

Mims III, Forrest, "Sun Photometer with Light-Emitting Diodes as Spectrally Selective Detectors", Applied Optics 31, 6965-6967, 1992.

Carr et al., "One-Watt GaAs p-n Junction Infrared Source", Applied Physics Letters, vol. 3, No. 10, Nov. 15, 1963, pp. 173-175.

W. N. Carr, "Photometric Figures of Merit for Semiconductor Luminescent Sources Operating in Spontaneous Mode", Infrared Physics, 1966, vol. 6, pp. 1-19.

Notification of Transmittal of the International Search Report and the Written Opinion of the International Authority, Searching International Application No. PCT/US2014/029230, dated Sep. 18, 2014, 18 pages.

* cited by examiner

COLOR TUNING OF LIGHT-EMITTING DEVICES

CROSS-REFERENCE TO RELATED APPLICATION

This application claims the benefit under 35 U.S.C. § 119(e)(1) of U.S. Provisional Application No. 61/788,737, filed on Mar. 15, 2013, which is incorporated by reference herein.

TECHNICAL FIELD

The described technology relates to color tuning of light-emitting devices including a symmetric or asymmetric light valve.

BACKGROUND

The described technology relates to color tuning of light-emitting devices including a symmetric or asymmetric light valve.

Light-emitting elements are ubiquitous in the modern world, being used in applications ranging from general illumination (e.g., light bulbs) to lighting electronic information displays (e.g., backlights and front-lights for LCDs) to medical devices and therapeutics. Solid state light emitting elements, which include light emitting diodes (LEDs), are increasingly being adopted in a variety of fields, promising low power consumption, high luminous efficacy and longevity, particularly in comparison to incandescent and other conventional light sources.

One example of a solid state light-emitting element increasingly being used for in luminaires is a so-called "white LED." Conventional white LEDs typically include an LED that emits blue or ultraviolet light and a phosphor or other luminescent material. The device generates white light via down-conversion of blue or UV light from the LED (referred to as "pump light") by the phosphor. Such devices are also referred to as phosphor-based LEDs (PLEDs). Although subject to losses due to light-conversion, various aspects of PLEDs promise reduced complexity, better cost efficiency and durability of PLED-based luminaires in comparison to other types of luminaires.

While new types of phosphors are being actively investigated and developed, configuration of PLED-based light-emitting devices, however, provides further challenges due to the properties of available luminescent materials. Challenges include light-energy losses from photon conversion, phosphor self-heating from Stokes loss, dependence of photon conversion properties on operating temperature, degradation due to permanent changes of the chemical and physical composition of phosphors in effect of overheating or other damage, dependence of the conversion properties on intensity of light, propagation of light in undesired directions in effect of the random emission of converted light that is emitted from the phosphor, undesired chemical properties of phosphors, and controlled deposition of phosphors in light-emitting devices, for example.

SUMMARY

The described technology relates to light-emitting devices that convert light and mix the converted light. The converted light can be mixed using a symmetric or asymmetric light valve, and/or a light guide, for example.

Accordingly, various aspects of the invention are summarized as follows.

In general, in a first aspect, the invention features a light-emitting device including a substrate having a first surface; at least one first light-emitting element (LEE) disposed on the first surface for emitting light having a first spectral composition; at least one second LEE disposed on the first surface for emitting light having a second spectral composition, the first and second spectral compositions being different; and a scattering element that includes an inelastic scattering material, where the scattering element surrounds, at least in part, the at least one first and second LEEs to scatter light emitted from the at least one first and second LEEs; and electrical connections for connecting the at least one first and second LEEs to a power source, where the electrical connections are arranged such that power to one or more of the at least one first LEE is separately adjustable relative to power to one or more of the at least one second LEE.

The foregoing and other embodiments can each optionally include one or more of the following features, alone or in combination. In some embodiments the at least one first LEE includes two or more first LEEs and the electrical connections can be arranged such that power to one or more LEE of the two or more first LEEs is separately adjustable relative to power to one or more other LEE of the two or more first LEEs. In some embodiments, the at least one second LEE includes two or more second LEEs and the electrical connections can be arranged such that power to one or more LEE of the two or more second LEEs is separately adjustable relative to power to one or more other LEE of the two or more second LEEs.

In some embodiments, the light-emitting device can further include a sensor that is arranged to receive a fraction of light output by the scattering element, where the sensor can be configured to provide a sensor signal based on the fraction of light, and wherein the sensor can be in communication with a control circuit configured to control power provided to the at least one second LEE in response to the sensor signal. In some embodiments, the light-emitting device includes the control circuit. In some embodiments, the sensor signal can be configured to provide an indication of an intensity of the light output by the scattering element. In some embodiments, the sensor signal can be configured to provide an indication of a spectral density distribution of the light output by the scattering element. In some embodiments, the light-emitting device can further include a non-photonic sensor. In some embodiments, the non-photonic sensor includes at least one of a temperature detector and a voltage detector.

In some embodiments, the light-emitting device can further include at least one third LEE disposed on the first surface for emitting light having a third spectral composition, where the third spectral composition is different from the first spectral composition. In some embodiments, the light-emitting device can further include at least one fourth LEE disposed on the first surface for emitting light having a fourth spectral composition, where the fourth spectral composition has a correlated color temperature different from the second spectral composition. In some embodiments, the scattering element includes a phosphor material. In some embodiments, the scattering element has a dome shape. In some embodiments, at least a portion of the first surface is a diffusely reflective surface. In some embodiments, at least a portion of the first surface is a specularly reflective surface. In some embodiments, the first spectral composition includes light with a narrow emission spectrum. In some embodiments, the second spectral composition includes light with a broad emission spectrum. In some embodiments, the at least one second LEE has a phosphor coating. In some embodiments, the second spectral composition has a low correlated color temperature. In some embodiments, the second spectral composition corresponds to white light.

In some embodiments, the scattering element can be spaced apart from the at least one first and second LEEs and coupled to the substrate to form an enclosure, where the scattering element can have an input surface facing the at least one first and second LEEs and an output surface opposing the input surface. In some embodiments, the substrate forms a cup. In some embodiments, the substrate is flat. In some embodiments, an index of refraction of the scattering element is larger than an index of refraction of a medium in the enclosure and larger than an index of refraction of an ambient environment.

In some embodiments, the light-emitting device can further include a light guide and light output by the scattering element can be coupled into the light guide. In some embodiments, the light-emitting device can further include an extractor element coupled to an output surface of the scattering element. In some embodiments, the light-emitting device can further include a light guide and light output by the extractor can be coupled into the light guide. In some embodiments, the light-emitting device can further include a light guide and the extractor can be coupled to the light guide. In some embodiments, an index of refraction of the scattering element can be larger than an index of refraction of the extractor element such that an acceptance angle for rays of light within the scattering element at the output surface is larger than an acceptance angle at an input surface of the scattering element. In some embodiments, an index of refraction of the scattering element can be equal or smaller than an index of refraction of the extractor element.

In some embodiments, the scattering element can be spaced apart from the at least one first and second LEEs and coupled to the substrate to form an enclosure, and an index of refraction of the scattering element can be larger than an index of refraction of a medium in the enclosure. In some embodiments, the extractor element can have a transparent exit surface opposing the output surface of the scattering element that is shaped such that an angle of incidence on the exit surface of the light provided by the scattering element that directly impinges on the exit surface is less than a critical angle for total internal reflection at the exit surface. In some embodiments, the scattering element can be a coating applied to a surface of the extractor element. In some embodiments, the scattering element can be a roughened surface of the extractor element facing the at least one first and second LEEs. In some embodiments, the at least one first and second LEEs and the scattering element can be arranged and the substrate can be configured such that light having substantially isotropic chromaticity is output by the scattering element.

In general, in a further aspect, the invention features a light-emitting device, including a substrate having a first surface; two or more light-emitting elements (LEEs) disposed on the first surface; and a scattering element that surrounds, at least in part, the two or more LEEs, where the scattering element includes inelastic scattering centers arranged to scatter light from the two or more LEEs, and where the scattering element includes multiple segments, each of the segments configured to provide light having one of two or more spectral compositions; and electrical connections for connecting the two or more LEEs to a power source, where the electrical connections are arranged such that power to at least one first LEE of the two or more LEEs is separately adjustable relative to power to at least one second LEE of the two or more LEEs.

The foregoing and other embodiments can each optionally include one or more of the following features, alone or in combination. In some embodiments, the electrical connections can be arranged such that power to at least one LEE of the two or more LEEs that correspond to at least one of the segments is separately adjustable relative to power to at least one other LEE of the two or more LEEs that correspond to another segment. In some embodiments, each segment of the multiple segments includes a phosphor layer that provides light with a corresponding correlated color temperature. In some embodiments, each segment of the multiple segments includes a phosphor layer that provides light with a corresponding chromaticity.

In some embodiments, the light-emitting device can further include a sensor arranged to receive a fraction of light output by the scattering element, where the sensor can be configured to provide a sensor signal based on the fraction of light, and where the sensor can be in communication with a control circuit configured to control power provided to at least some of the two or more LEEs. In some embodiments, the light-emitting device includes the control circuit. In some embodiments, the sensor signal can be configured to provide an indication of an intensity of the light output by the scattering element. In some embodiments, the sensor signal can be configured to provide an indication of a spectral density distribution of the light output by the scattering element. In some embodiments, the light-emitting device can further include a non-photonic sensor. In some embodiments, the non-photonic sensor can include at least one of a temperature detector and a voltage detector.

In some embodiments, the scattering element has a dome shape. In some embodiments, at least a portion of the first surface is a diffusely reflective surface. In some embodiments, at least a portion of the first surface is a specularly reflective surface. In some embodiments, the scattering element can be spaced apart from the two or more LEEs and coupled to the substrate to form an enclosure, where the scattering element has an input surface facing the two or more LEEs and an output surface opposing the input surface. In some embodiments, at least a portion of the substrate forms a cup. In some embodiments, the substrate is flat. In some embodiments, an index of refraction of the scattering element can be larger than an index of refraction of a medium in the enclosure and larger than an index of refraction of an ambient environment.

In some embodiments, the light-emitting device can further include a light guide and light output from the scattering element can be coupled into the light guide. In some embodiments, the light-emitting device can further include an extractor element coupled to an output surface of the scattering element. In some embodiments, the light-emitting device can further include a light guide and light output from the extractor element is coupled into the light guide. In some embodiments, the light-emitting device can further include a light guide and wherein the extractor element is coupled to the light guide. In some embodiments, an index of refraction of the scattering element can be larger than an index of refraction of the extractor element such that an acceptance angle for rays of light within the scattering element at the output surface is larger than an acceptance angle at an input surface of the scattering element. In some embodiments, an index of refraction of the scattering element can be equal or smaller than an index of refraction of the extractor element.

In some embodiments, the scattering element can be spaced apart from the at least one first and second LEEs and coupled to the substrate to form an enclosure, and an index of refraction of the scattering element can be larger than an index of refraction of a medium in the enclosure. In some embodiments, the extractor element can have a transparent exit surface opposing the output surface of the scattering element that is shaped such that an angle of incidence on the exit surface of the light provided by the scattering element that directly impinges on the exit surface is less than a critical angle for total internal reflection at the exit surface. In some embodiments, the scattering element can be a coating applied to a surface of the extractor element. In some embodiments, the scattering element can be a roughened surface of the extractor element.

In general, in a further aspect, the invention features a method for generating output light, including providing at least one first light-emitting element (LEE) on a first surface of a substrate for emitting light having a first spectral composition; providing at least one second LEE on the first surface for emitting light having a second spectral composition, where the first and second spectral compositions are different; and scattering light emitted from the at least one first and second LEEs by a scattering element surrounding, at least in part, the at least one first and second LEEs to provide output light; and providing electrical connections for connecting the at least one first and second LEEs to a power source, where the electrical connections are arranged such that power to one or more of the at least one first LEE is separately adjustable relative to power to one or more of the at least one second LEE.

The foregoing and other embodiments can each optionally include one or more of the following features, alone or in combination. In some embodiments, the at least one first LEE includes two or more first LEEs and the electrical connections can be arranged such that power to one or more LEE of the two or more first LEEs is separately adjustable relative to power to one or more other LEE of the two or more first LEEs. In some embodiments, the at least one second LEE includes two or more second LEEs and the electrical connections can be arranged such that power to one or more LEE of the two or more second LEEs is separately adjustable relative to power to one or more other LEE of the two or more second LEEs.

In some embodiments, the method can further include providing at least one third LEE disposed on the first surface for emitting light having a third spectral composition, where the third spectral composition can be different from the first spectral composition. In some embodiments, the method can further include providing at least one fourth LEE disposed on the first surface for emitting light having a fourth spectral composition, where the fourth spectral composition can have a correlated color temperature different from the second spectral composition. In some embodiments, the scattering element includes a phosphor material. In some embodiments, the scattering element has a dome shape. In some embodiments, at least a portion of the first surface is a diffusely reflective surface. In some embodiments, at least a portion of the first surface is a specularly reflective surface. In some embodiments, the first spectral composition includes light with a narrow emission spectrum. In some embodiments, the second spectral composition includes light with a broad emission spectrum. In some embodiments, the at least one second LEE has a phosphor coating. In some embodiments, the second spectral composition has a low correlated color temperature. In some embodiments, the second spectral composition corresponds to white light.

In some embodiments, the scattering element can be spaced apart from the at least one first and second LEEs and coupled to the substrate to form an enclosure, where the scattering element has an input surface facing the at least one first and second LEEs and an output surface opposing the input surface. In some embodiments, at least a portion of the substrate forms a cup. In some embodiments, the substrate is flat. In some embodiments, an index of refraction of the scattering element can be larger than an index of refraction of a medium in the enclosure and larger than an index of refraction of an ambient environment.

In some embodiments, the method can further include providing a light guide and light output by the scattering element is coupled into the light guide. In some embodiments, the method can further include providing an extractor element coupled to an output surface of the scattering element. In some embodiments, the method can further include providing a light guide and light output by the extractor element is coupled into the light guide. In some embodiments, the method can further include providing a light guide and the extractor element can be coupled to the light guide. In some embodiments, an index of refraction of the scattering element can be larger than an index of refraction of the extractor element such that an acceptance angle for rays of light within the scattering element at the output surface is larger than an acceptance angle at an input surface of the scattering element. In some embodiments, an index of refraction of the scattering element can be equal or smaller than an index of refraction of the extractor element.

In some embodiments, the scattering element can be spaced apart from the at least one first and second LEEs and coupled to the substrate to form an enclosure, and where an index of refraction of the scattering element can be larger than an index of refraction of a medium in the enclosure. In some embodiments, the extractor element can have a transparent exit surface opposing the output surface of the scattering element that is shaped such that an angle of incidence on the exit surface of the light provided by the scattering element that directly impinges on the exit surface is less than a critical angle for total internal reflection at the exit surface. In some embodiments, the scattering element can be a coating applied to a surface of the extractor element. In some embodiments, the scattering element can be a roughened surface of the extractor element facing the at least one first and second LEEs. In some embodiments, the at least one first and second LEEs and the scattering element can be arranged and the substrate can be configured such that light having substantially isotropic chromaticity is output by the scattering element.

In general, in a further aspect, the invention features a light-emitting device including: a substrate having a first surface; two or more light-emitting elements (LEEs) disposed on the first surface, where at least some of the two or more LEEs emit pump light and at least one LEE emits white light, and where a light output of the at least one LEE emitting white light can be adjusted; a first optical element having a first surface spaced apart from the two or more LEEs and positioned to receive light from the two or more LEEs, the first optical element including scattering centers arranged to scatter light from the two or more LEEs; and a second optical element having an exit surface, where the second optical element is transparent and in contact with the first optical element, there being an optical interface between the first and second optical elements at the place of contact, the optical interface being opposite the first surface of the first optical element, the second optical element being arranged to receive at least a portion of the light through the optical interface; where: a medium adjacent to the first surface of the first optical element has a refractive index $n_0$; the first optical element includes a material having a first refractive index $n_1$, where $n_0<n_1$; the second optical element includes a material having a refractive index $n_2$, where $n_0<n_2$; and the exit surface is a transparent surface that is shaped such that an angle of incidence on the exit surface of the light provided by the first optical element that directly impinges on the exit surface is less than a critical angle for total internal reflection.

The foregoing and other embodiments can each optionally include one or more of the following features, alone or in combination. In some embodiments, $n_0$, $n_1$ and $n_2$ can be selected such that an amount of light transmitting from the first optical element into the second optical element is larger than an amount of light transmitting from the first optical element into the medium adjacent the first surface. In some embodiments, the light-emitting device can further include a light guide and light output by the second optical element is coupled into the light guide. In some embodiments, the light-emitting device can further include a light guide and the second optical element is coupled to the light guide. In some embodiments, the at least some of the LEEs that emit pump light are controlled independently from the at least one LEE that emits white light.

In general, in a further aspect, the invention features a light-emitting device including: a substrate having a first surface; two or more light-emitting elements (LEEs) disposed on the first surface; a first optical element having a first surface spaced apart from the two or more LEEs and positioned to receive light from at least one of the two or more LEEs, where the first optical element includes scattering centers arranged to scatter light from the two or more LEEs, the first optical element includes multiple segments, where each segment is configured to provide light having one of two or more spectral compositions, and where a light output of LEEs corresponding to the multiple segments of the first optical element can be adjusted; and a second optical element having an exit surface, the second optical element being transparent and in contact with the first optical element, there being an optical interface between the first and second optical elements at the place of contact, the optical interface being opposite the first surface of the first optical element, the second optical element being arranged to receive at least a portion of the light through the optical interface; where: a medium adjacent to the first surface of the first optical element has a refractive index $n_0$; the first optical element includes a material having a first refractive index $n_1$, where $n_0<n_1$; the second optical element includes a material having a refractive index $n_2$, where $n_0<n_2$; and the exit surface is a transparent surface that is shaped such that an angle of incidence on the exit surface of the light provided by the first optical element that directly impinges on the exit surface is less than a critical angle for total internal reflection.

The foregoing and other embodiments can each optionally include one or more of the following features, alone or in combination. In some embodiments, $n_0$, $n_1$ and $n_2$ can be selected such that an amount of light transmitting from the first optical element into the second optical element is larger than an amount of light transmitting from the first optical element into the medium adjacent the first surface. In some embodiments, the light-emitting device can further include a light guide and light output by the second optical element is coupled into the light guide. In some embodiments, the light-emitting device can further include a light guide and the second optical element is coupled to the light guide. In some embodiments, each segment of the multiple segments can include a corresponding phosphor layer. In some embodiments, LEEs corresponding to a set of the multiple segments can be controlled independently from LEEs corresponding to another set of the plurality of segments.

Amongst other advantages, embodiments of the light-emitting devices can be configured to provide converted light with an emission spectrum that can be substantially independent of certain variations in the spectra of the pump light sources (e.g., long-term degradation of phosphor or drifting conversion properties of phosphor.) The light-emitting devices can include a scattering element that mixes light which is output by the light sources. The described technology can help stabilize the emission spectrum and thereby chromaticity and/or color temperature of the light provided by the illumination device.

DETAILED DESCRIPTION

Over the lifetime of phosphor-based light-emitting devices color variation can occur, for example, due to long-term degradation of phosphor. The level of phosphor degradation can be dependent on the operating temperature of the light-emitting device. Moreover, conversion properties of a phosphor may drift and depend on operating temperature, light exposure or other parameters, for example. Furthermore, color control by a user during operation by the light-emitting device may be desirable.

Figure 1A:
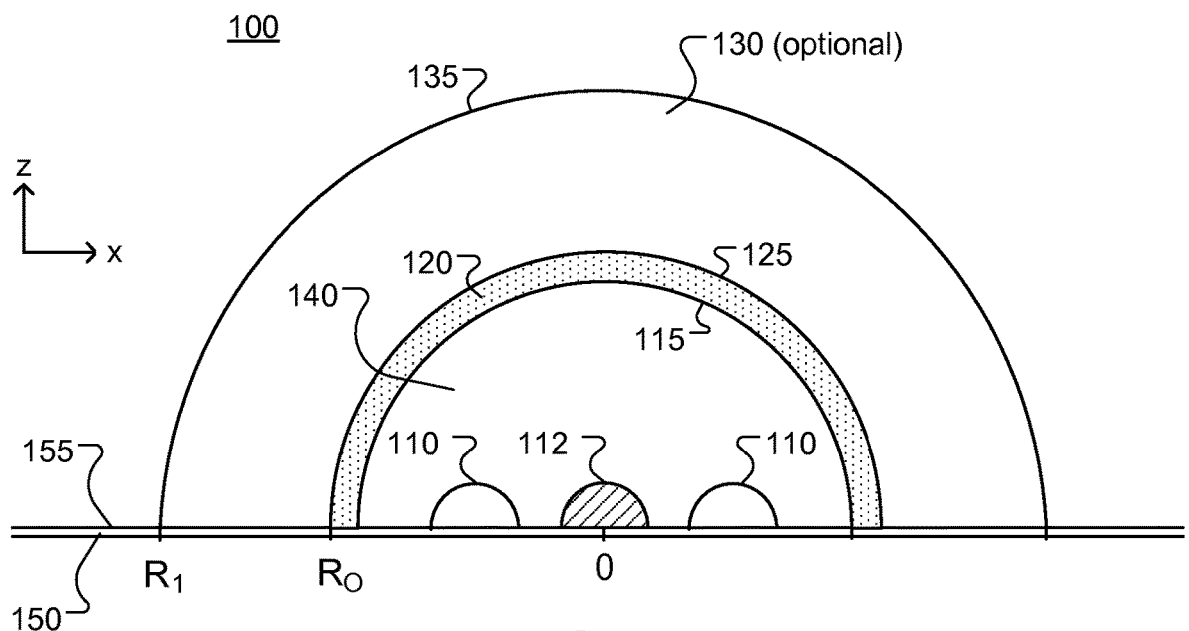
FIGS. 1A and 1B are cross-sectional views of an example of a light-emitting device with multiple light-emitting elements.
Figure 1B:
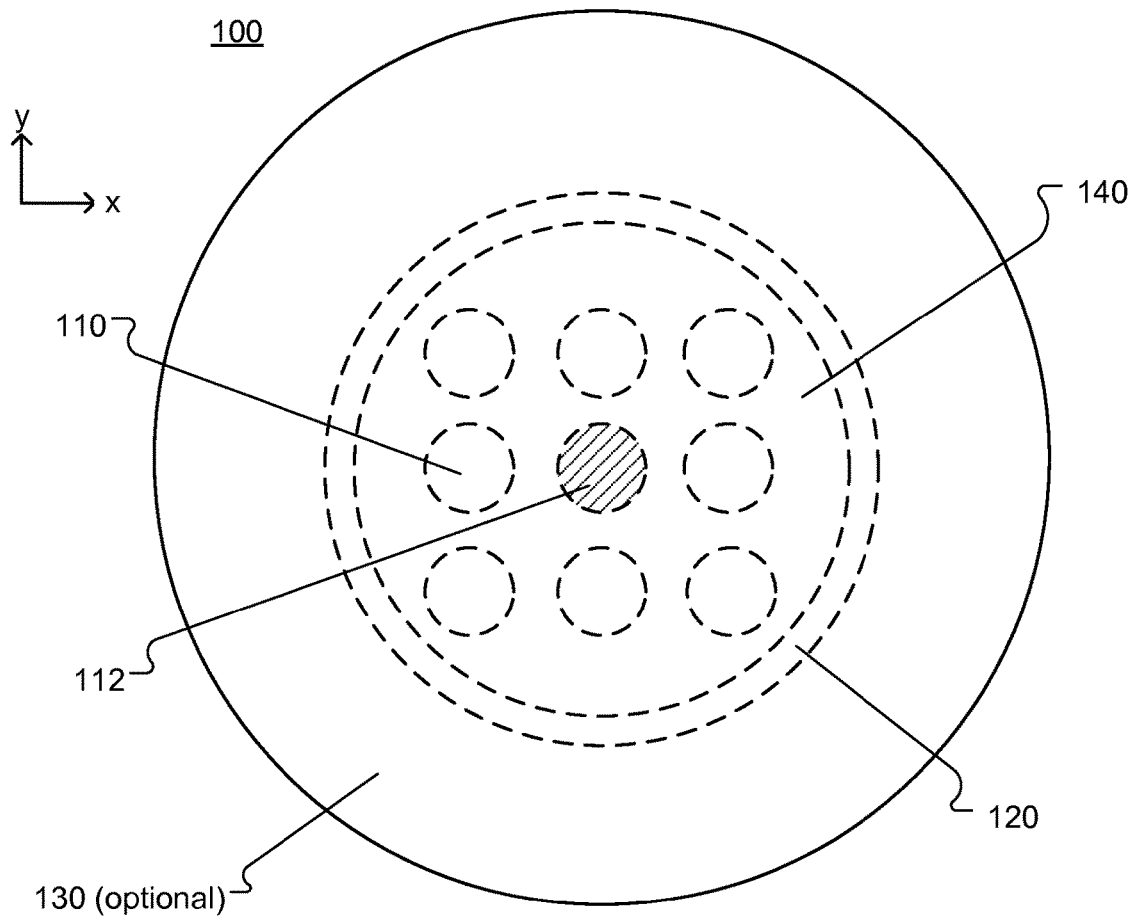

FIGS. 1A and 1B are cross-sectional views of an example of a light-emitting device 100 with multiple light-emitting elements 110 and 112. FIG. 1A shows a side sectional view of the light-emitting device 100. FIG. 1B shows a top view of the light-emitting device 100. The example light-emitting device 100 includes a substrate 150, multiple light-emitting elements 110 with a narrow emission spectrum (e.g., blue pump LEDs), one or more light-emitting elements that have a broad emission spectrum 112, referred to as broadband LEE (e.g., a white LED), a scattering element 120, and an extractor element 130. Depending on the implementation, the scattering element 120 is configured to elastically, inelastically or both elastically and inelastically scatter light. In some implementations, the extractor element 130 is omitted from the light-emitting device 100. Different broad-band LEEs can have different emission spectra, for example one or more white LEDs with about 2700 K correlated color temperature and one or more white LEDs with about 5000 K. Multiple LEEs with different broad-band emission spectra can help better approximate a desired chromaticity and/or correlated color temperature of the light emitted by the light-emitting device during control and/or compensation of ageing effects, for example.

In some implementations, the light-emitting device 100 includes an optional light guide (not illustrated). Depending on the implementation, the scattering element 120 and/or the extractor element 130 are configured to couple light into the light guide. An optical coupling of the scattering element and/or the extractor with the light guide can be achieved via an additional suitably shaped hollow or solid coupler (not illustrated). The coupling also can be provided via a suitably configured extractor. Such an extractor can have various shapes. For example, the extractor can be shaped between radii $R_0$ and $R_1$, to guide light via TIR or otherwise in a forward direction and then couple with the light guide.

The light guide guides the light and may provide additional mixing and/or other functions, for example. Depending on the implementation, the light guide can guide light via specular mirror reflection and/or TIR. The length of the light guide parallel to the z-axis and the shape of the cross section of the light guide perpendicular to the z-axis and/or its variation along the z-axis can determine the degree of mixing provided by the light guide. The light guide can have straight and/or curved portions in an elongate extension parallel to the y-axis, for example. In some implementations, the light guide has a tubular, square, triangular, hexagonal or other regular or irregular cross section within planes perpendicular to the optical axis of the light-emitting device that is perpendicular to the z-axis, for example.

The cross section of a light guide can change in orientation and/or size along the z-axis. For example, the section can have a hexagonal shape that rotates by Pi/3 every centimeter and/or widens towards half of its length before it tapers again towards the far end opposite of the scattering element.

In some implementations, multiple hemi-spherical example light-emitting devices, such as light-emitting devices 100 as illustrated in FIGS. 1A and 1B, may be arranged along a length of a light guide that is elongate along the y-axis, for example. In some implementations, multiple light-emitting devices with a tubular scattering element extending along the y-axis, and with multiple light-emitting elements 110/112, may be arranged along a light guide that is elongate along the y-axis, for example.

The substrate 150 can have a surface 155. In some implementations, the surface 155 can be reflective (e.g., a mirror). The scattering element 120 can have a first surface 115 spaced apart from the light-emitting elements 110 and 112 and positioned to receive the light from the light-emitting elements 110 and 112. The light-emitting elements 110 and 112 can be disposed on the surface 155 of the substrate 150, in an opening that is, at least in part, defined by the first surface 115 (e.g., having a radius $R_O$).

The substrate 150 can extend within the x-y plane up to (not illustrated) or beyond point R1. The surface 155 can be provided by a reflective layer (not illustrated) that can be wider or narrower in the x-y plane than the substrate 150. Furthermore, the substrate 150 can be disposed on a reflective layer. The scattering element 120 can be located on the inside of the extractor element 130 adjacent an enclosure 140 (e.g., a semispherical enclosure of radius $R_O$) of the extractor element 130 and form an optical interface 125. In some implementations, the scattering element can be a layer (e.g., coating) with scattering centers. In some implementations, the scattering element can be a roughening of the inner surface of the extractor. The enclosure 140 can be filled with a medium (e.g., gas or air) and encloses the light-emitting elements 110 and 112, and at least a portion of the surface 155. The scattering element 120 can have a spherical, hemi-spherical or other shape. Such shapes can range from dome-like via flat to bowl-like shapes. The scattering element can have one or more indentations. An example light-emitting device with a flat scattering element may have a substrate configured similarly to the one of the example light-emitting device of FIGS. 2C and 2D.

Depending on the implementation, the medium in the enclosure 140 can be a gaseous or other medium having a refractive index $n_0$ that is greater or equal to 1 and smaller or equal to a refractive index $n_{120}$ of the scattering element 120 ($1 \leq n_0 \leq n_{120}$), or the medium can have a refractive index $n_0$ that is greater or equal to a refractive index $n_{120}$ of the scattering element 120 ($n_0 \geq n_{120}$). The refractive index of the medium in the enclosure 140 may have a refractive index comparable to the refractive indices of the light-emitting elements, for example. The medium in the enclosure 140 surrounds the light-emitting elements 110, 112 and separates the light-emitting elements from the scattering element 120. In some implementations, the medium can be of a high refractive index material (for example, a solid or a liquid).

In some implementations, the refractive indices of the components on either side of the scattering element 120 relative to the refractive index of the scattering element 120 are chosen such that the acceptance angle at the optical interface 125 of the scattering element 120 is larger than the acceptance angle at the first surface 115 of the scattering element 120. The acceptance angle in these cases refers to the incidence angles of light rays at the corresponding surfaces that do not undergo total internal reflection. As such and considering a scattering element with an isotropic photon density this situation may be referred to as an asymmetric light valve. It is noted that an asymmetric light valve is not necessarily limited to implementations in which TIR may occur at an optical interface 125. For example, the scattering element 120 may have substantially the same or a large refractive index as the extractor element 130 in which case there is no TIR and hence the acceptance angle concept does not apply. As such and depending on the implementation an optical interface 125 may not exist except between the scattering centers and the surrounding host material in the scattering element, for example.

In some implementations that include an extractor, the exit surface 135 of the extractor element 130 is shaped as a spherical or a cylindrical dome or shell with a radius R1 in which the optical interface is disposed within an area defined by a respective notional sphere or cylinder that is concentric with the exit surface and has a radius $R_{OW}=R1/n_{130}$, wherein $n_{130}$ is the refractive index of the extractor element 130. Such a configuration is referred to as Weierstrass geometry or Weierstrass configuration. It is noted that a spherical Weierstrass geometry can avoid total internal reflection (TIR) for rays passing through the area circumscribed by a corresponding notional $R1/n_{130}$ sphere irrespective of the plane of propagation. A cylindrical Weierstrass geometry can exhibit TIR for light that propagates in planes that intersect the respective cylinder axis at shallow angles even if the light passes through an area circumscribed by a corresponding notional $R_{OW}=R1/n_{130}$ cylinder.

It is noted that other light-emitting devices can have exit surfaces with other shapes and/or other geometrical relations with respect to the optical interface. For instance, a non-spherical or non-cylindrical exit surface of the extractor element 130 can be employed to refract light and aid in shaping an output intensity distribution in ways different from those provided by a spherical or cylindrical exit surface. The definition of the Weierstrass geometry can be extended to include exit surfaces with non-circular sections by requiring that the optical interface falls within cones, also referred to as acceptance cones, subtended from points p of the exit surface whose axes correspond to respective surface normals at the points p and which have an apex of 2*Arcsin $(k/n_{130})$, wherein k is a positive number smaller than $n_{130}$. It is noted that the exit surface needs to be configured such that the plurality of all noted cones circumscribe a space with a non-zero volume. It is further noted that k is assumed to refer to a parameter that determines the amount of TIR at an uncoated exit surface that separates an optically dense medium, having $n_{130}>1$, on one side of the exit surface making up the extractor element 130 from a typical gas such as air with n~1.00 at standard temperature and pressure conditions, on the opposite side of the exit surface. Depending on the embodiment, k can be slightly larger than 1 but is preferably less than 1. If k>1, some TIR may occur at the exit surface inside the extractor element 130. In some embodiments, this results in the optical interface being at least $R(p)*(1-k/n_{130})$ away from the exit surface in a direction normal to the exit surface at a point p thereof. Here, R(p) is the local radius of curvature of the exit surface at the point p, and $n_{130}$ is the refractive index of the extractor element 130. For a spherical or cylindrical exit surface with k=1, the boundaries circumscribed by the noted cones correspond with a spherical or cylindrical Weierstrass geometry, respectively. Some embodiments are configured to allow for some TIR by choosing k>1. In such cases, $k/n_{130}$ is limited to $k/n_{130}<0.8$, for example.

In summary, an illumination device is said to satisfy the Weierstrass configuration if a radius $R_O$ of the optical interface is less than or equal to $R_O \leq R_{OW} = R1/n_{130}$, where R1 and $n_{130}$ respectively are the radius and index of refraction of the extractor element 130. Equivalently, the extractor element 130 of a light-emitting device is said to satisfy the Weierstrass configuration if a radius $R_1$ of an extractor element 130, which has an index of refraction $n_{130}$, is equal to or larger than $R_1 \geq R_{1W} = n_{130} R_O$, where $R_O$ is the radius of the optical interface of the illumination device.

In some implementations, the exit surface 135 of the extractor element 130 can have a radius $R_1$ that is concentric with the optical interface 125, such that the extractor element 130 satisfies the Brewster configuration $R_1 \geq R_{1B}$. When the optical interface is between the extractor and air, the Brewster radius is given by $R_{1B} = R_O(1+n_{130}^2)^{+1/2}$, where $R_O$ is the radius of the optical interface 125 of the light-emitting device 100, and $n_{130}$ denotes the index of refraction of the material of the extractor element 130. As the extractor element 130 satisfies the Brewster configuration, an angle of incidence on the exit surface 135 of the scattered light that directly impinges on the exit surface 135 is less than the Brewster angle, and as such, the scattered light that directly impinges on the exit surface 135 experiences substantially no total internal reflection and limited Fresnel reflections thereon.

In the example device illustrated in FIGS. 1A and 1B, light propagation asymmetry arises, for example, from the materials on the inside (index $n_0$) and outside (index $n_{130}$) of the scattering element 120 with index $n_{120}$ being unequal. For instance, if $n_{120}=1.5$ and $n_0=1.0$, that is $n_0<n_{120}$, a large fraction (~75%) of the isotropically distributed photons impinging on the first surface 115 will be reflected by total internal reflection (TIR) back into the scattering element 120 and only a smaller fraction (~25%) will be transmitted backwards into the enclosure 140 from where some may reach the light-emitting elements 110 or 112. At the optical interface 125, the condition $n_{120} \leq n_{130}$ will guarantee photons reaching the optical interface 125 will transition into the extractor element 130 without TIR, and the Brewster condition will further guarantee that a substantial portion of these photons can transmit into the ambient environment without TIR through the exit surface 135. Only a small fraction (down to about ~4% depending on incidence angle) will be returned by Fresnel reflection at the exit surface 135.

In a general aspect, a light-emitting device (e.g., 100) includes a substrate (e.g., 150) having a surface (e.g., 155); two or more LEEs (e.g., 110, 112) configured to emit light, where at least one of the two or more LEEs (e.g., 112) is coated with a phosphor layer; a first optical element (e.g., a scattering element 120) that has a first surface (e.g., 115) spaced apart from the LEEs and positioned to receive light from at least one of the LEEs, where the first optical element includes scattering centers arranged to scatter light from the LEEs; and a second optical element (e.g., an extractor element 130) that has an exit surface (e.g., 135), where the second optical element is transparent and in contact with the first optical element, there being an optical interface (e.g., 125) between the first and second optical elements at the place of contact, where the optical interface is opposite the first surface of the first optical element, and where the second optical element is arranged to receive at least a portion of the light through the optical interface. A medium adjacent to the first surface of the first optical element has a refractive index $n_0$; the first optical element includes a material that has a first refractive index $n_1$, where $n_0 < n_1$; the second optical element includes a material that has a refractive index $n_2$, where $n_0 < n_2$; and the exit surface is a transparent surface that is shaped such that an angle of incidence on the exit surface of the light provided by the first optical element that directly impinges on the exit surface is less than a critical angle for total internal reflection.

While the light-emitting device 100 shown in FIGS. 1A and 1B includes an extractor element, light-emitting devices without extractor element are also possible. Generally, light mixed in the scattering element can be output directly from the scattering element into the ambient environment without first passing through an extractor element.

In implementations of light-emitting devices with an extractor element, the refractive index of the extractor element can be larger, equal, or smaller than the refractive index of the scattering element. In implementations of light-emitting devices, where the extractor element is omitted, the refractive index of the scattering element is generally larger than the refractive index of the ambient environment.

Returning to FIGS. 1A and 1B, the light-emitting device 100 can include multiple light-emitting elements 110, such as blue LEDs 110 and one or more light-emitting elements 112, such as white LEDs (a white LED can include a blue LED coated with a phosphor layer). The light-emitting element 112 can have a low color temperature. For example, the light-emitting device 100 can have a target correlated color temperature of 3000 Kelvin and the light-emitting element 112 can have a correlated color temperature of 2700 Kelvin. Initially, the light-emitting element 112 can be dimmed to a low light output. When, over time, the scattering element 120 of the light-emitting device 100 degrades, the emission spectrum of the light-emitting device 100 may shift to a bluer color. This color shift can be compensated by increasing the light output from the light-emitting element 112 such that the light-emitting device maintains a consistent emission spectrum over its lifetime. In other embodiments, for example when due to ageing the scattering element would shift to a redder color, a cooler white LED can be used to offset the ageing effects if adequately controlled.

Figure 1C:
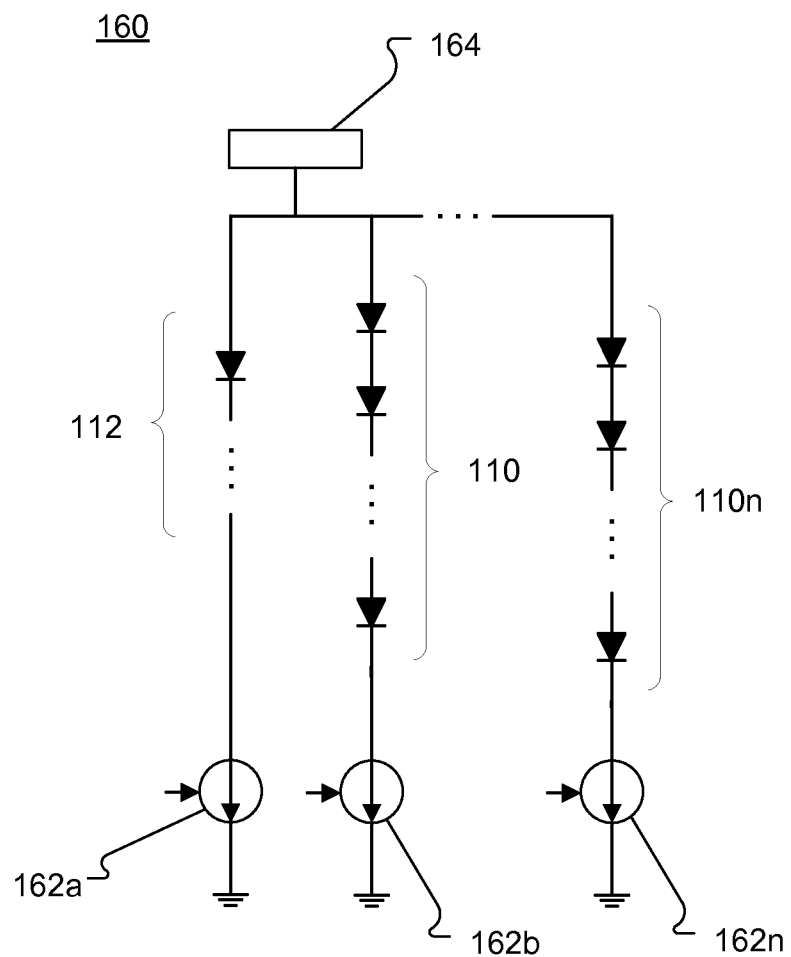
FIG. 1C is an example of a control circuitry for a light-emitting device.

FIG. 1C is an example of control circuitry 160 for a light-emitting device, such as light-emitting device 100. Any number of light-emitting elements can be electrically connected in series (e.g., dependent on the desired light intensity and voltage drop). Generally, the light-emitting elements of the light-emitting device 100 can be split into groups that are controlled independently of each other to allow independent control of the brightness of each group of light-emitting elements. Generally, the split can be by correlated color temperature (CCT), chromaticity or otherwise. In case of FIG. 1C, the split is by chromaticity and CCT. Light-emitting elements of each group can be electrically connected in series, in parallel or in a mixed series and parallel manner, which may be determined based on desired voltage drops and/or drive currents, for example. As shown in FIG. 1C, light-emitting element 112 can be controlled by a current source 162a and the group of light-emitting elements 110 can be controlled by current source 162b. The light-emitting elements can be split into n groups (e.g., 112, 110, ... 110n) that are controlled independently by n current sources (e.g., 162a, 162b, ... 162n). The groups of light-emitting elements are electrically connected in parallel to a voltage source, such as voltage source 164, to provide, in conjunction with the corresponding current sources, power to the groups of light-emitting elements.

Figure 2A:
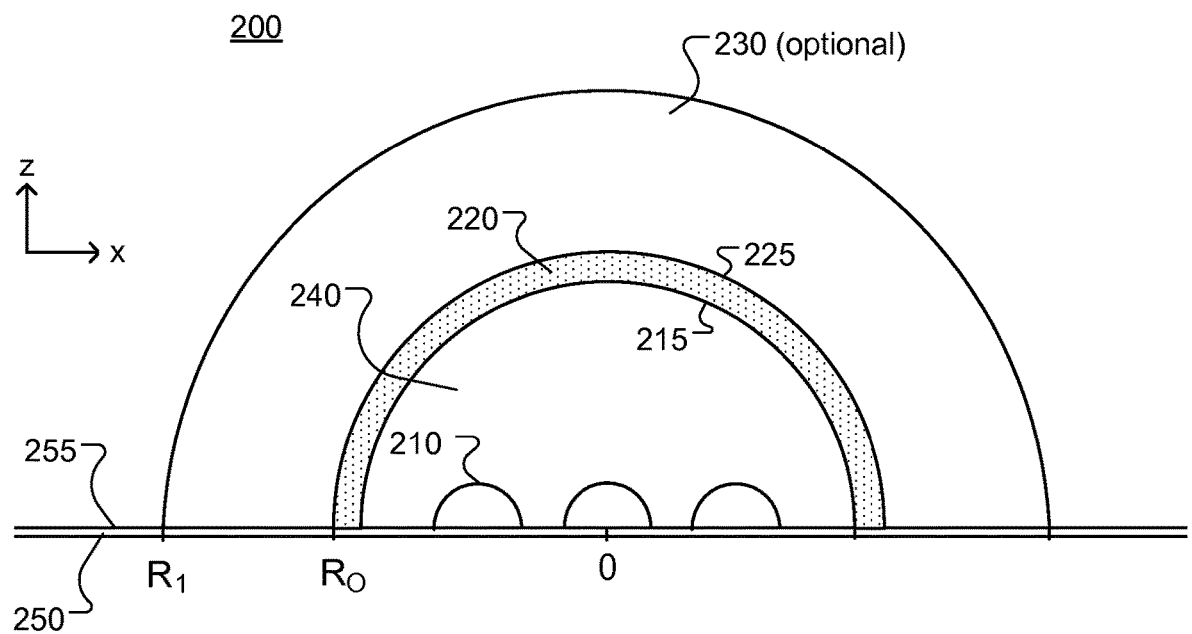
FIGS. 2A and 2B are views of an example of a light-emitting device with a segmented scattering element.
Figure 2B:
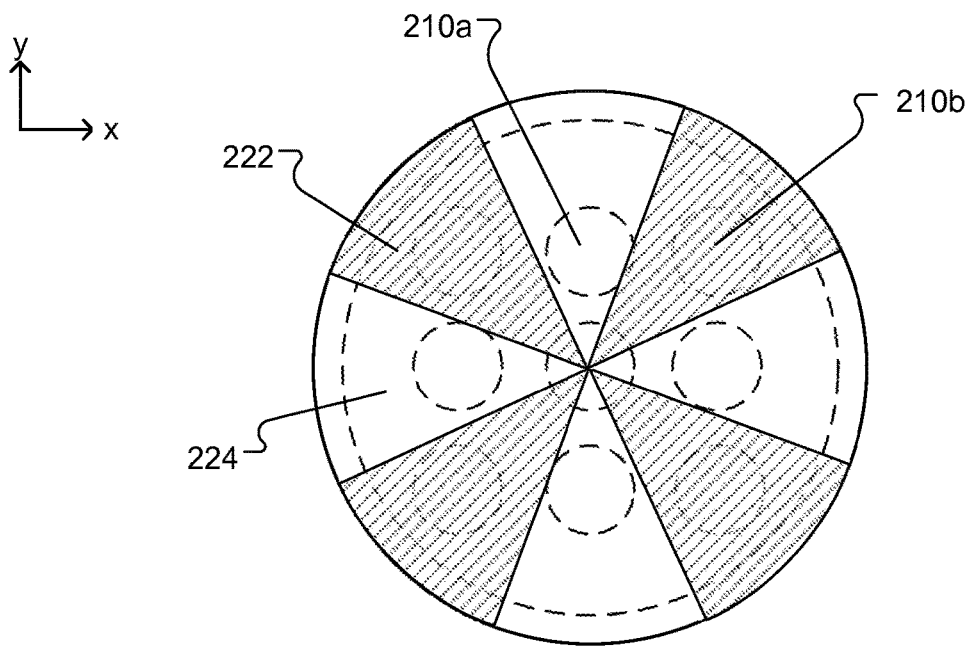

FIG. 2A is a cross-sectional side view of a light-emitting device 200 with a segmented scattering element 220. The light-emitting device 200 includes a substrate 250, multiple light-emitting elements 210a/210b (e.g., blue pump LEDs), a segmented scattering element 220, and an extractor element 230. In some implementations, the extractor element 230 is omitted from the light-emitting device 200. FIG. 2B shows a top view of the segmented scattering element 220. Different segments of the segmented scattering element 220 can have different shapes. Segments can have circular or spherical shapes or other regular or irregular shapes and can form a mosaic of segments. Different segments can have different light conversion properties including different absorption spectra, different white points and/or different color points of the converted light or other properties, for example. The substrate 250 can have a surface 255. In some implementations, the surface 255 can be reflective (e.g., a mirror). The segmented scattering element 220 has a first surface 215 spaced apart from the light-emitting elements 210a/210b and positioned to receive the light from the light-emitting elements 210a/210b.

The light-emitting elements 210a/210b are disposed on the surface 255 of the substrate 250, in an opening that is defined by the first surface 215 of the segmented scattering element 220 (e.g., having a radius $R_O$). The light-emitting elements can be placed such that one or more light-emitting elements correspond to a particular segment of the segmented scattering element 220. In some implementations, sizes of the respective areas of the scattering element segments can be substantially the same or different relative to each other.

The substrate 250 can extend within the x-y plane up to (not illustrated) or beyond point R1. The surface 255 can be provided by a reflective layer (not illustrated) that can be wider or narrower in the x-y plane than the substrate 250. Furthermore, the substrate 250 can be disposed on a reflective layer. The segmented scattering element 220 can be located on the inside of the extractor element 230 adjacent an enclosure 240 (e.g., a semispherical enclosure of radius $R_O$) of the extractor element 230 to form an optical interface 225. The enclosure 240 can be filled with a medium (e.g., gas or air) and encloses the light-emitting elements 210a/210b, and a portion of the surface 255. In this example, the extractor element 230 has a hemi-spherical shape. Other implementations can have extractors of other portions of a sphere or other shapes in general.

In this example, the light-emitting device 200 includes multiple light-emitting elements 210a and 210b, such as blue pump LEDs, disposed on the surface 255 of the substrate 250. In some implementations, the segments of the segmented scattering element 220 can include or be formed of multiple phosphor layers (e.g., coatings,) such as phosphor layer 222 and 224. The phosphor layers 222 and 224 can be configured such that the correlated color temperature of phosphor layer 222 is different from the correlated color temperature of phosphor layer 224.

In some implementations, the segmented scattering element 220 can include a uniform phosphor layer and additional phosphor layer applied to portions of the segmented scattering element 220. For example, the uniform phosphor layer can produce a correlated color temperature of about 3000 Kelvin and the additional phosphor layer, which is included with portions of the segmented scattering element 220, can alter the correlated color temperature of the corresponding portions of the segmented scattering element 220. The altered correlated color temperature can be higher or lower than the correlated color temperature of the uniform phosphor layer.

In this example, the light-emitting elements 210a are located below the phosphor layer 224 and arranged to pump the area covered by the phosphor layer 224 and the light-emitting elements 210b are located below the phosphor layer 222 and arranged to pump the area covered by the phosphor layer 222. For example, the light-emitting elements 210a can be configured to pump the area covered by the phosphor layer 224 stronger than the light-emitting elements 210b pump the area covered by the phosphor layer 222. Therefore, during initial operation, the light-emitting elements 210a located below the phosphor layer 224 can be dimmed. When, over time, the phosphor layers degrade, the emission spectrum of the light-emitting device 200 may shift to a blue color. This color shift can be compensated by increasing the light output of the light-emitting elements 210a located below the phosphor layer 224 or vice versa, such that the light-emitting device maintains a consistent emission spectrum over its lifetime.

In some implementations, the segmented scattering element (e.g., 220) can include segmented phosphor layers to produce multiple correlated color temperatures. In some implementations, the light-emitting elements (e.g., 210a and 210b) can be of different colors. In some implementations, the described embodiments can be implemented to shift the correlated color temperature from one color to another color.

While the light-emitting device 200 shown in FIG. 2A includes an extractor element, light-emitting devices without an extractor element are also possible. Generally, light mixed in the scattering element can be output directly from the scattering element into the ambient environment without first passing through an extractor element.

Figure 2C:
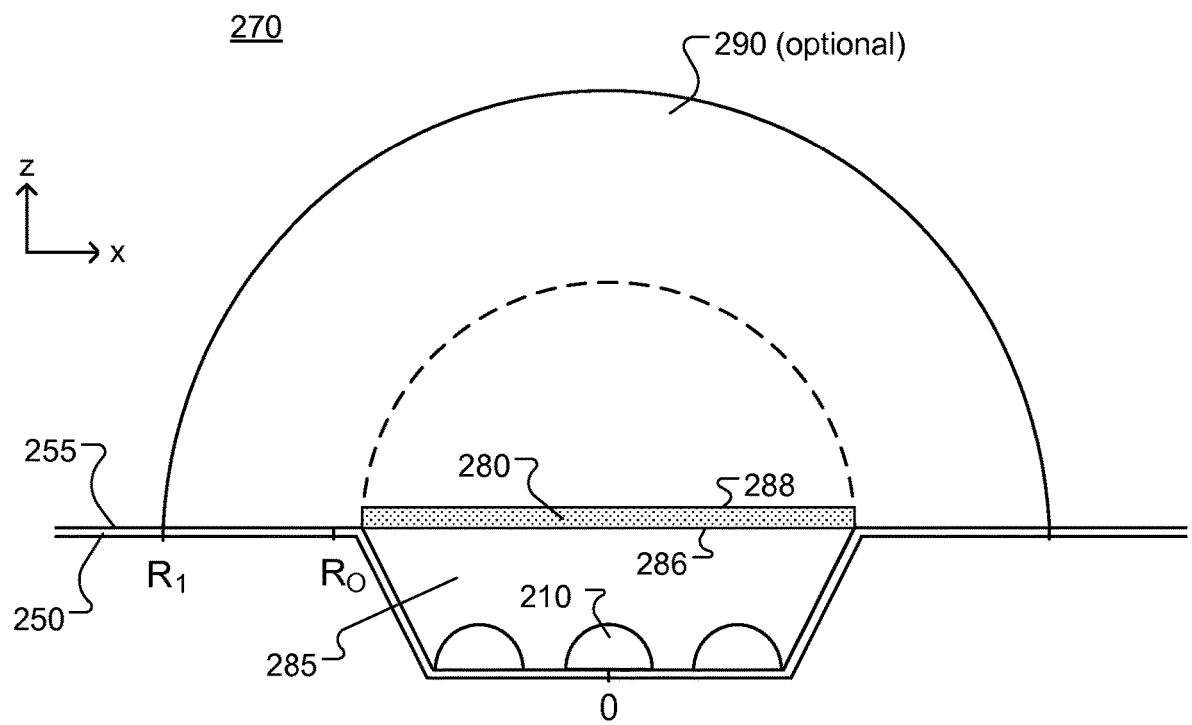
FIGS. 2C and 2D are views of another example of a light-emitting device with a segmented scattering element.
Figure 2D:
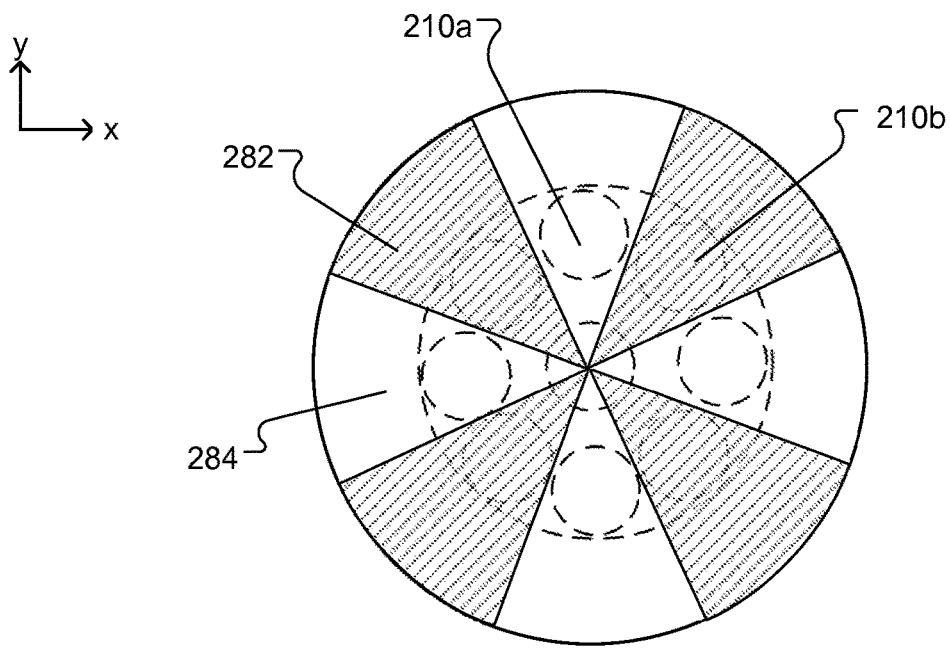

FIG. 2C is a cross-sectional side view of another example light-emitting device 270 with a segmented flat scattering element 280. The example light-emitting device 270 includes a substrate 250, multiple light-emitting elements 210a/210b (e.g., blue pump LEDs), a segmented scattering element 280, and an extractor element 290. In some implementations, the light emitting device 270 can also include a light guide as described herein. FIG. 2D shows a top view including the segmented scattering element 280. Different segments of the segmented scattering element 280 can have different shapes. The segments can have polygonal, circular or other regular or irregular shapes and can form a mosaic of segments. Different segments can have different light conversion properties including different absorption spectra, different white points and/or different color points of the converted light or other properties, for example. The substrate 250 has a surface 255. The surface 255 is reflective (e.g., a mirror). The segmented scattering element 280 has a first surface 286 spaced apart from the light-emitting elements 210a/210b and positioned to receive the light from the light-emitting elements 210a/210b, and a light output surface 288.

The light-emitting elements 210a/210b are disposed in a recessed portion with an aperture having a radius of about R0 of the substrate 250. The scattering element 280 covers the aperture of the recessed portion of the substrate 250 defining an enclosure 285. The light-emitting elements 210a/210b can be placed such that one or more light-emitting elements correspond to a particular segment of the segmented scattering element 280. In some implementations, sizes of the respective areas of the scattering element segments can be substantially the same or different relative to each other.

The substrate 250 extends within the x-y plane beyond point R1. The surface 255 can be provided by a reflective layer (not illustrated) that can be wider or narrower in the x-y plane than the substrate 250. Furthermore, the substrate 250 can be disposed on a reflective layer. The enclosure 285 can be filled with a medium (e.g., gas or air or higher refractive index material) and encloses the light-emitting elements 210a/210b, and a portion of the surface 255. In this example, the extractor element 290 has a hemi-spherical shape. Other implementations can have extractor shapes that correspond with other portions of a sphere or have other shapes in general.

In this example, the light-emitting device 270 includes multiple light-emitting elements 210a and 210b, such as blue pump LEDs, disposed on the surface 255 of the substrate 250. In some implementations, the segments of the segmented scattering element 280 can include or be formed of multiple phosphor layers (e.g., coatings,) such as phosphor layer 282 and 284. The phosphor layers 282 and 284 can be configured such that the correlated color temperature of phosphor layer 282 is different from the correlated color temperature of phosphor layer 284.

In some implementations, the segmented scattering element 280 can include a uniform phosphor layer and additional phosphor layer applied to portions of the segmented scattering element 280. For example, the uniform phosphor layer can produce a correlated color temperature of about 3000 Kelvin and the additional phosphor layer, which is included with portions of the segmented scattering element 280, can alter the correlated color temperature of the corresponding portions of the segmented scattering element 280. The altered correlated color temperature can be higher or lower than the correlated color temperature of the uniform phosphor layer. In some implementations, different segments of the scattering element 280 include different types of phosphors. This can help control amounts of converted light emitted by one phosphor reaching another phosphor and thereby help mitigate parasitic absorption of converted light.

In this example, the light-emitting elements 210a are located below the phosphor layer 284 and are arranged to pump the area covered by the phosphor layer 284. The light-emitting elements 210b are located below the phosphor layer 282 and are arranged to pump the area covered by the phosphor layer 282. For example, the light-emitting elements 210a can be configured to pump the area covered by the phosphor layer 284 stronger than the light-emitting elements 210b pump the area covered by the phosphor layer 282. Therefore, during initial operation, the light-emitting elements 210a located below the phosphor layer 284 can be dimmed. When, for example over time or during operation, the phosphor layers alter, the emission spectrum of the light-emitting device 270 may shift to a blue color. Such a color shift can be compensated by for example increasing the light output of the light-emitting elements 210a located below the phosphor layer 284 or vice versa, such that the light-emitting device maintains a consistent emission spectrum over its lifetime.

In some implementations, a segmented scattering element (e.g., 220 or 280) can include segmented phosphor layers to produce multiple correlated color temperatures. In some implementations, light-emitting elements (e.g., 210a and 210b) can be of different colors. In some implementations, the described embodiments can be implemented to shift the correlated color temperature during operation from one color to another color by controlling the drive currents provided to different light-emitting elements.

While the light-emitting device 270 shown in FIG. 2C includes an extractor element, light-emitting devices without an extractor element are also possible. Generally, light mixed in the scattering element can be output directly from the scattering element into the ambient environment without first passing through an extractor element.

In implementations of light-emitting devices with an extractor element, the refractive index of the extractor element can be larger, equal, or smaller than the refractive index of the scattering element. In implementations of light-emitting devices, where the extractor element is omitted, the refractive index of the scattering element is generally larger than the refractive index of the ambient environment.

Figure 2E:
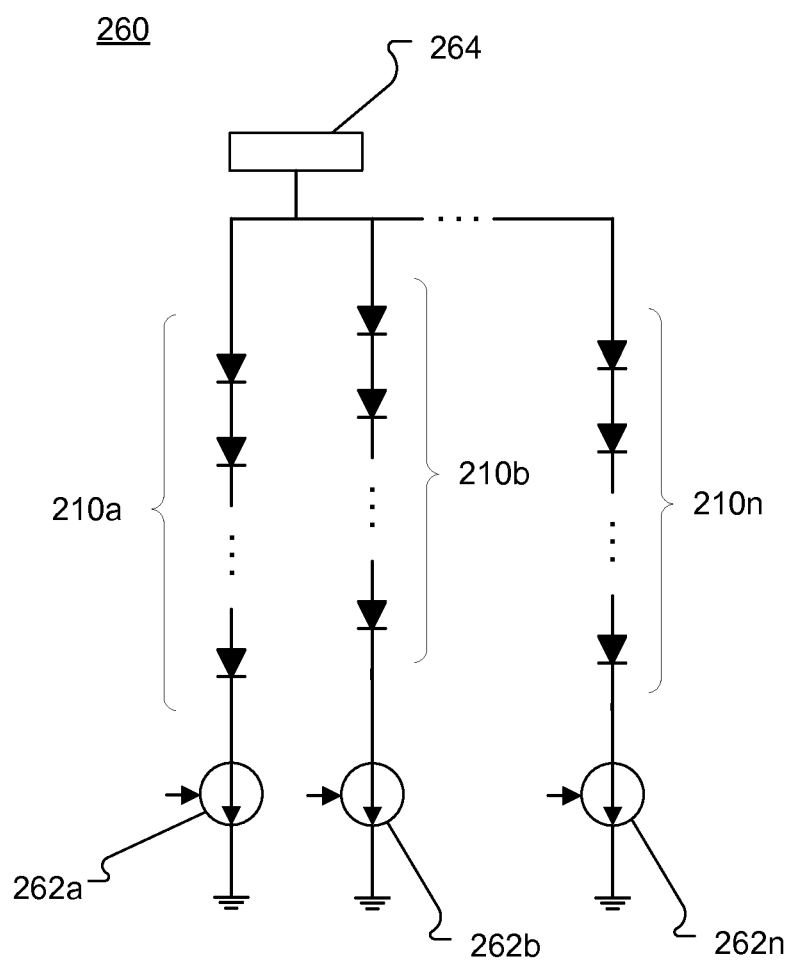
FIG. 2E is another example of a control circuitry for a light-emitting device.

FIG. 2E is an example of control circuitry 260 for a light-emitting device, such as light-emitting device 200, to control light-emitting elements of the light-emitting device. Generally, the light-emitting elements of the light-emitting device can be split into groups that are controlled independently of each other to allow independent control of the brightness of each group of light-emitting elements. Generally, the split can be by correlated color temperature CCT, chromaticity or otherwise. The split can be by association between phosphor layers and their corresponding light-emitting elements, such as phosphor layers 222 or 224 and light-emitting elements 210a and 210b. As shown in FIG. 2C, the group of light-emitting elements 210a can be controlled by a current source 262a and the group of light-emitting elements 210b can be controlled by current source 262b. The light-emitting elements can be split into n groups (e.g., 210a, 210b, . . . 210n) that are controlled independently by n current sources (e.g., 262a, 262b, . . . 262n). The groups of light-emitting elements are electrically connected in parallel to a voltage source, such as voltage source 264, to provide, in conjunction with the corresponding current sources, power to the groups of light-emitting elements.

In some implementations, the light-emitting device can include a sensor that measures color coordinates of the light emitted by the light-emitting elements. In some implementations, the sensor can be configured to indicate estimates of light intensity, spectral density, or both. The sensor can be coupled with a control loop that can be configured to dim the color or brightness of individual light sources, for example, when a portion of a phosphor layer degrades less over time than other portions of the phosphor layer, or some phosphor layers degrade less over time than other phosphor layers. Such control mechanisms can maintain constant illumination pattern or color distribution of the light-emitting device over its lifetime. For example, when portions of a phosphor layer degrade over time, blue light may become more visible. The shift to blue light can be compensated by adjusting the output (e.g., dimming) of the light-emitting elements respective to their position in the light-emitting device, whether or not a light-emitting element is located below a degraded portion of the phosphor layer.

Light-emitting devices, such as light-emitting devices 100, 200 and/or 270, can be controlled in a feed forward, a feedback or a mixed feed forward and feedback manner. In a feed forward control scheme, drive currents and/or drive voltages of different groups of light-emitting elements may be determined based on one or more of these drive currents and/or drive voltages alone or in other ways, for example.

In some implementations, a light-emitting device includes an optional light guide (not illustrated). Depending on the implementation, a scattering element, such as scattering element 220 or 280, and/or an extractor element, such as extractor element 230 or 290 (if present) can be configured to couple light into the light guide. An optical coupling of the scattering element and/or the extractor with the light guide can be achieved via an additional suitably shaped hollow or solid coupler (not illustrated). The coupling also can be provided via a suitably configured extractor. Such an extractor can have various shapes. For example, the extractor can be shaped between radii $R_0$ and $R_1$ in such a way (not illustrated), to guide light via TIR or otherwise in a forward direction and then couple with the light guide.

The light guide guides the light and may provide additional mixing and/or other functions, for example. Depending on the implementation, the light guide can guide light via specular mirror reflection and/or TIR. The length of the light guide parallel to the z-axis and the shape of the cross section of the light guide perpendicular to the z-axis and/or its variation along the z-axis can determine the degree of mixing provided by the light guide. The light guide can have straight and/or curved portions in an elongate extension parallel to the y-axis, for example. In some implementations, the light guide has a tubular, square, triangular, hexagonal or other regular or irregular cross section within planes perpendicular to the optical axis of the light-emitting device that is perpendicular to the z-axis (see e.g. FIGS. 2A and 2C,) for example.

The cross section of a light guide can change in orientation and/or size along the z-axis. For example, the section can have a hexagonal shape that rotates by Pi/3 every centimeter and/or widens towards half of its length before it tapers again towards the far end opposite of the scattering element.

In some implementations, multiple light-emitting devices, such as light-emitting devices according to FIGS. 2A and 2B or 2C and 2D, for example, may be arranged along a length of a light guide that is elongate along the y-axis, for example. In some implementations, such light-emitting devices may share one or more tubular scattering elements extending along the y-axis. Multiple light-emitting elements may be arranged along a light guide that is elongate along the y-axis, for example. Instead of spherical shaped segments (e.g., as illustrated in FIG. 2B,) the tubular scattering element can have ring-shaped segments or other regular or irregular shaped segments, for example.

Figure 3:
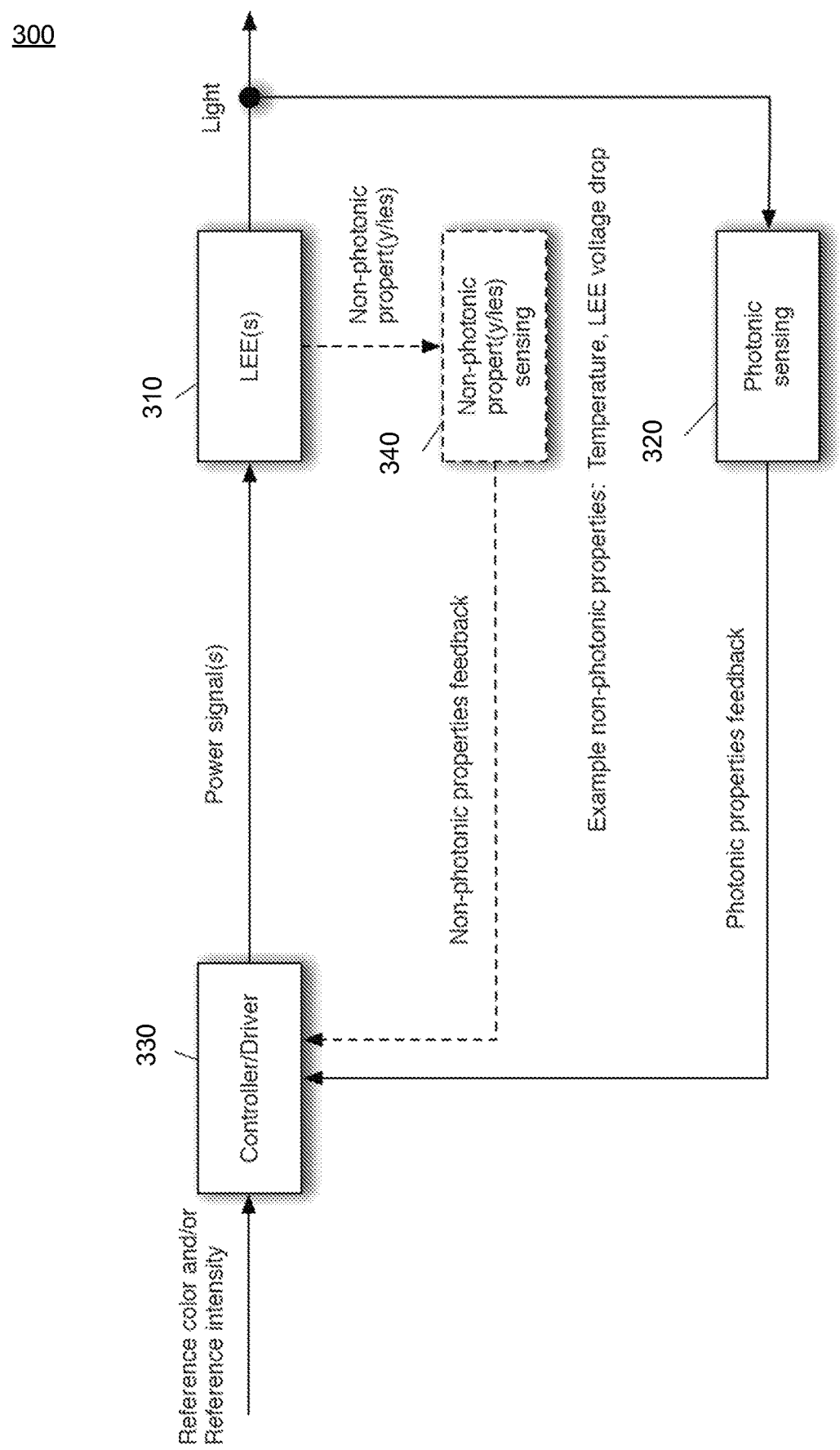
FIG. 3 is a schematic diagram showing an example feedback circuit used to provide intra-system source feedback for a light-emitting device.

FIG. 3 is a schematic diagram showing an example feedback circuit 300 used to provide intra-system source feedback in a light-emitting device, such as the light-emitting devices 100, 200, and/or 270. The feedback circuit 300 can be used to control one or more groups of light-emitting elements (e.g., adjust the brightness) of the light-emitting device. In this example, the feedback circuit 300 includes a photonic sensing unit 320 and a controller 330.

The photonic sensing unit 320 can be placed to sample scattered mixed light, for example downstream from a scattering element of the light-emitting device, to sense scattered light propagating within an extractor element of the light-emitting device. In some implementations, the photonic sensing unit 320 can include a color detector, an intensity detector, or a combination of both. In some implementations, one or more of the detectors can be arranged such that mostly scattered light that is Fresnel-reflected at an exit interface of the extractor element is being sensed. Moreover, the one or more detectors can be arranged such that the scattered light reflected by the exit surface of the extractor element and received by the sensor originates from a large portion of an optical interface between the scattering element and the extractor element.

The controller unit 330 can be implemented as hardware, software or a combination of both. For example, the controller unit 330 can be implemented as a software driver executed by a specialized or general purpose chip. The controller unit 330 parses sensing signals received from the photonic sensing unit 320. Parsed signal values are compared by the controller unit 330 to reference color values or reference intensity values, referred to as reference values. The controller unit 330 accesses such reference values in one or more lookup tables, for instance. For example, the controller unit 330 selectively transmits adjustment signals to a power driver to adjust relative power values for a combination of different color light-emitting elements 310, in response to sensing that chromaticity of the scattered light propagating in the extractor element has changed. As another example, the controller unit 330 selectively transmits adjustment signals to the power driver to adjust power values for one or more light-emitting elements 310, in response to sensing that the intensity of the scattered light propagating in the extractor element has changed.

In some implementations, the feedback circuit 300 can include a non-photonic properties sensing unit 340. Examples of non-photonic properties sensed by this unit are temperature, voltage drop, etc. In such implementations, the controller unit 330 parses the non-photonic sensing signals received from the non-photonic properties sensing unit 340 in combination with the photonic sensing signals received from the photonic sensing unit 320. Values of the parsed combination of photonic and non-photonic sensing signals are used by the controller unit 330 to transmit adjustment signals to the driver that drives the LEEs 310.

The invention claimed is:

1. A light-emitting device, comprising:
   a substrate having a first surface;
   a plurality of blue pump light-emitting elements (LEEs) disposed on the first surface;
   a scattering element surrounding, at least in part, the plurality of blue pump LEEs, the scattering element comprising inelastic scattering centers arranged to scatter light from the plurality of blue pump LEEs, wherein the scattering element includes a plurality of segments, the segments arranged over subsets of blue pump LEEs of the plurality of blue pump LEEs, such that a projection of each segment onto a plane defined by the substrate overlaps at least in part with a projection onto the plane of the blue pump LEEs in the corresponding subset of blue pump LEEs, and each subset of blue pump LEEs comprises
  a first blue pump LEE that is common among all the subsets such that the projection onto the plane of the first blue pump LEE partially overlaps with the projection onto the plane of each of the segments, and
  a second blue pump LEE that is different from second blue pump LEEs of adjacent subsets, such that the projection onto the plane of the second blue pump LEE overlaps with the projection onto the plane of a respective one of the segments, and each of the segments is configured to provide light having one of two or more spectral compositions; and electrical connections for connecting the plurality of blue pump LEEs to a power source, the electrical connections being arranged such that power to a blue pump LEE of the plurality of blue pump LEEs is separately adjustable relative to power to another blue pump LEE of the plurality of blue pump LEEs.

2. The light-emitting device of claim 1, wherein the electrical connections are arranged such that power to at least one blue pump LEE of the plurality of blue pump LEEs that correspond to at least one of the segments is separately adjustable relative to power to at least one other blue pump LEE of the plurality of blue pump LEEs that correspond to another segment.

3. The light-emitting device of claim 1, wherein each segment of the plurality of segments comprises a phosphor layer that provides light with a corresponding correlated color temperature.

4. The light-emitting device of claim 1, wherein each segment of the plurality of segments comprises a phosphor layer that provides light with a corresponding chromaticity.

5. The light-emitting device of claim 1, further comprising a sensor arranged to receive a fraction of light output by the scattering element, the sensor being configured to provide a sensor signal based on the fraction of light, wherein the sensor is in communication with a control circuit configured to control power provided to at least some of the plurality of blue pump LEEs.

6. The light-emitting device of claim 5, wherein the light-emitting device includes the control circuit.

7. The light-emitting device of claim 5, wherein the sensor signal is configured to provide an indication of an intensity of the light output by the scattering element.

8. The light-emitting device of claim 5, wherein the sensor signal is configured to provide an indication of a spectral density distribution of the light output by the scattering element.

9. The light-emitting device of claim 1, further comprising a non-photonic sensor.

10. The light-emitting device of claim 9, wherein the non-photonic sensor includes at least one of a temperature detector and a voltage detector.

11. The light-emitting device of claim 1, wherein the scattering element has a dome shape.

12. The light-emitting device of claim 1, wherein at least a portion of the first surface is a diffusely reflective surface.

13. The light-emitting device of claim 1, wherein at least a portion of the first surface is a specularly reflective surface.

14. The light-emitting device of claim 1, wherein the scattering element is spaced apart from the plurality of blue pump LEEs and coupled to the substrate to form an enclosure, the scattering element having an input surface facing the plurality of blue pump LEEs and an output surface opposing the input surface.

15. The light-emitting device of claim 14, wherein at least a portion of the substrate forms a cup.

16. The light-emitting device of claim 14, wherein the substrate is flat.

17. The light-emitting device of claim 14, wherein an index of refraction of the scattering element is larger than an index of refraction of a medium in the enclosure and larger than an index of refraction of an ambient environment.

18. The light-emitting device of claim 1, further comprising a light guide and wherein light output by the scattering element is coupled into the light guide.

19. The light-emitting device of claim 1, further comprising an extractor element coupled to an output surface of the scattering element.

20. The light-emitting device of claim 19, further comprising a light guide and wherein light output from the extractor element is coupled into the light guide.

21. The light-emitting device of claim 19, further comprising a light guide and wherein the extractor element is coupled to the light guide.

22. The light-emitting device of claim 19, wherein an index of refraction of the scattering element is larger than an index of refraction of the extractor element such that an acceptance angle for rays of light within the scattering element at the output surface is larger than an acceptance angle at an input surface of the scattering element.

23. The light-emitting device of claim 19, wherein an index of refraction of the scattering element is equal or smaller than an index of refraction of the extractor element.

24. The light-emitting device of claim 19, wherein the scattering element is spaced apart from the plurality of blue pump LEEs and coupled to the substrate to form an enclosure, and wherein an index of refraction of the scattering element is larger than an index of refraction of a medium in the enclosure.

25. The light-emitting device of claim 19, wherein the extractor element has a transparent exit surface opposing the output surface of the scattering element that is shaped such that an angle of incidence on the exit surface of the light provided by the scattering element that directly impinges on the exit surface is less than a critical angle for total internal reflection at the exit surface.

26. The light-emitting device of claim 19, wherein the scattering element is a coating applied to a surface of the extractor element.

* * * * *